(12) United States Patent
Tuncer et al.

(10) Patent No.: US 11,569,153 B2
(45) Date of Patent: Jan. 31, 2023

(54) LEADFRAMES WITH FOLDED CONDUCTOR PORTION AND DEVICES THEREFROM

(71) Applicant: Texas Instruments Incorporated, Dallas, TX (US)

(72) Inventors: Enis Tuncer, Dallas, TX (US); John Paul Tellkamp, Rockwall, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/819,902

(22) Filed: Mar. 16, 2020

(65) Prior Publication Data
US 2021/0287970 A1 Sep. 16, 2021

(51) Int. Cl.
*H01L 21/48* (2006.01)
*H01L 23/495* (2006.01)
*H01L 43/04* (2006.01)

(52) U.S. Cl.
CPC .... *H01L 23/49551* (2013.01); *H01L 21/4842* (2013.01); *H01L 23/49503* (2013.01); *H01L 23/49562* (2013.01); *H01L 43/04* (2013.01)

(58) Field of Classification Search
CPC ........... H01L 23/49562; H01L 21/4842; H01L 43/04; H01L 23/49551; H01L 23/49503
USPC ....................................................... 257/421
See application file for complete search history.

(56) References Cited

U.S. PATENT DOCUMENTS

| 6,921,967 | B2 | 7/2005 | Tzu et al. |
| 7,821,116 | B2 | 10/2010 | Madrid |
| 8,022,776 | B2 | 9/2011 | Chang et al. |
| 10,892,405 | B2* | 1/2021 | Li ........................ H01L 43/065 |

OTHER PUBLICATIONS

Qattawi, A., "Extending Origami Technique to Fold Forming of Sheet Metal Products," Clemson University TigerPrints—All Dissertations, Jan. 2012, 222 pages, 1392, Dissertations at TigerPrints, USA.

* cited by examiner

*Primary Examiner* — Hrayr A Sayadian
(74) *Attorney, Agent, or Firm* — Ronald O. Neerings; Frank D. Cimino

(57) ABSTRACT

A leadframe includes leads or lead terminals, a plurality of folded features including i) support features positioned within an area defined in at least one dimension by the leads or the lead terminals configured for supporting at least one of a die pad and a first pad and a second pad spaced apart from one another, or ii) current carrying features. At least one of the folded features includes a planar portion and a folded edge structure that curves upwards at an angle of at least 45° relative to the planar portion. The folded features are configured to provide an effective increase in thickness to reduce the deformation observed in assembly.

26 Claims, 7 Drawing Sheets

LEADFRAMES WITH FOLDED CONDUCTOR PORTION AND DEVICES THEREFROM

FIELD

This Disclosure relates to leadframes and devices including leadframes that operate under high current flows, such as field-effect transistors (FETs) and current sensors.

BACKGROUND

There are a variety of packaged devices that operate under high current flow in the leadframe, such as power FETs, gate drivers, and some sensor devices. Sensor devices include current sensors such as shunt-type current sensors, and thermal (temperature) sensors. The shunt for a current shunt sensor bridges between first and second pads, while the thermal sensor can be on a die attach pad, or on another leadframe feature.

For a current sensor example, a Hall-effect sensor is one commonly used type of current sensor that generally operates at high current including through their reduced width curved head portion (also called a loop portion) that is between an I+ fused lead and I− fused lead. The Hall-effect is known to be the generation of a potential difference (voltage) across an electrical conductor typically being a doped semiconductor material, known as a Hall voltage, when a magnetic field is applied in a direction perpendicular to the flow of current in the electrical conductor. A Hall-effect sensor is a transducer that varies its output voltage in response to a magnetic field created by a current to be measured by the sensor, where the current to be measured can be an alternating current (AC) or a direct-current (DC).

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes for leadframes one can fold or bend additional material to form folded features in addition to a conventional planar metal conductor portion of a leadframe for a high current flow device to reduce the resistance of generally any leadframe feature, and/or to increase the mechanical strength to resist unintentional bending during assembly. High current flow devices include current sensor devices, or generally any other device that operates with high current flow in the leadframe, such as power FETs and drivers.

This Disclosure also recognizes for devices having a power pad, such as the power pad for high current applications including conventional Hall-effect sensor packages, have several limitations. For example, during assembly the power pad in a 50 A shunt current sensor device may not provide sufficient mechanical support for handling, leading to bending of the power pad. High joule heating (JH) in such current sensing devices during their normal operation can also limit the operating temperature of the device/package, where this operating temperature limit can be based on either the internal package temperature or on the ambient temperature. The root cause of these problems is recognized herein to be an insufficient leadframe thickness resulting in a current carrying cross-sectional area being too small. As a result, conventional leadframes for such current sensing devices do not provide a sufficiently high current handling capability, or heat transfer path, nor do conventionally leadframes provide sufficient mechanical support in assembly to avoid bending during the handling.

These limitations result in the devices only supporting lower current operation, such as in the case of a current sensor a current limit of about 15 A to 20 A of maximum field generating current (FGC). This can limit the maximum possible magnetic field strength and potentially causing excessive JH due to a leadframe thermal dissipation issue, as well as lowering the sensitivity of the sensor device which depends on the magnetic field strength ($\mu$V resolution) that is set by the operating current level. Other shortcomings include a relatively high DC resistance, and a high voltage induced dielectric breakdown problem that can be due to the dielectric breakdown of the mold compound or of the passivation dielectric layer(s) on the top surface of the Hall-effect IC die.

Disclosed aspects solve the above-described leadframe problems by providing leadframe designs having additional leadframe material that is then bent relative to the planar portion to form folded conductor portions referred to herein as folded features. The folded features result in an effective increase in metal thickness (such as by a factor of two) for one or more selected portions of the leadframe.

Disclosed aspects include a leadframe comprising leads or lead terminals generally on at least opposing sides, and a plurality of folded features. The folded features include i) support features positioned within an area defined in at least one dimension by the leads or the lead terminals configured for supporting at least one of a die pad and a first pad and a second pad spaced apart from one another, or ii) current carrying features. At least one of the support features includes a planar portion and a folded edge structure that curves upwards at an angle of at least 45° relative to the planar portion. The folded edge structure is configured to provide an effective increase in metal thickness, which provides benefits including reducing the deformation observed in assembly.

BRIEF DESCRIPTION OF THE DRAWINGS

Reference will now be made to the accompanying drawings, which are not necessarily drawn to scale, wherein:

FIG. 4A is a top view of a leadframe shown as a half leadframe that is illustrating a die pad and additional material in die pad sections shown as shaded regions and located on the edge of the die pad on a side of the FET die, before bending and folding with arrows showing the direction to be folded. FIG. 4B shows a three-dimensional (3D) depiction of the packaged FET shown in FIG. 4A after folding the additional material to provide folded features. FIG. 4C is a front view of the packaged FET shown in FIG. 4B from the perspective of one's eye being on the far left.

DETAILED DESCRIPTION

Figure 1A:
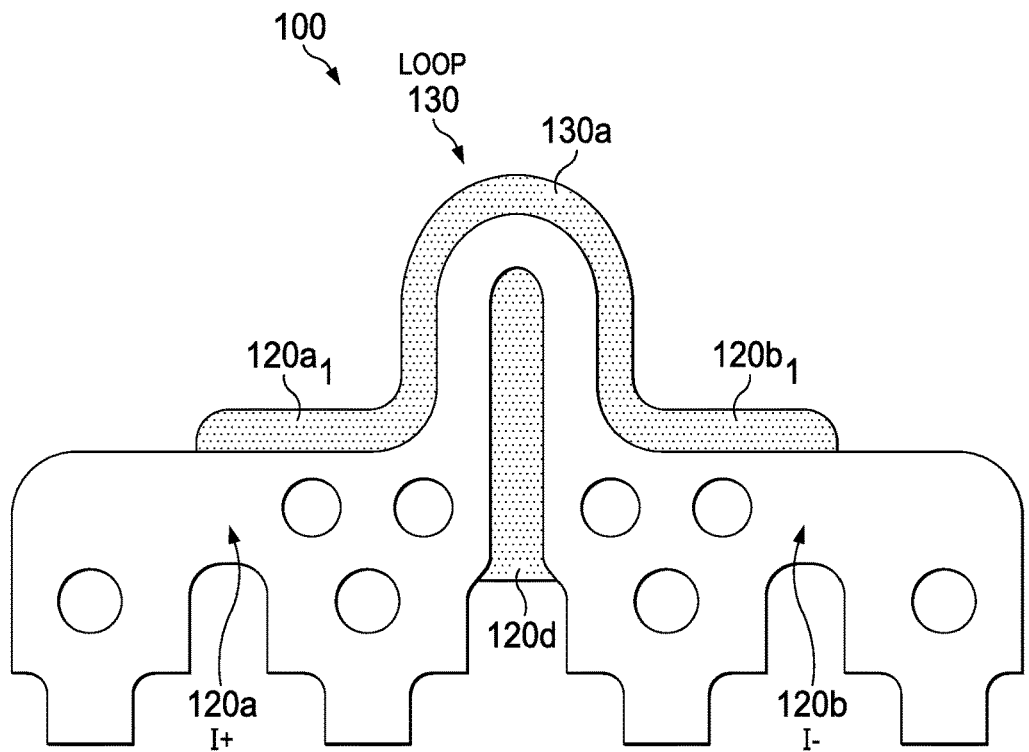
FIG. 1A shows a top view of a side of a leadframe for a Hall-effect current sensor having the loop portion (or head portion) including additional material beyond that of a conventional leadframe shown as a shaded area along the loop portion, and also additional material along the leads adjacent to the loop portion.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Disclosed folded conductor features provides at least one of mechanical function feature and an electrical function. When the folded conductor feature is an electrical function feature, the folded conductor provides a current density reduction as compared to the otherwise same conductor without the folded conductor, which is particularly useful for high current device applications. When the folded conductor feature is a mechanical function feature, the folded conductor feature assists during assembly handling by resisting stress-induced deformation of the leadframe. Disclosed folded features for conductors can provide both a mechanical function and an electrical function. For example, disclosed folded conductor shunt pads can be used for a current shunt type of current sensor to provide both a mechanical function and an electrical function.

FIG. 1A shows a top view of a side of a leadframe 100 for a Hall-effect current sensor having the loop portion (or head portion) 130 including additional material (before bending) beyond that of a conventional leadframe showing the additional material 130a as a shaded area along the loop portion 130, and also additional material 120d between the inside of the leads 120a and 120b both shown as fused leads, with additional material also along the inner edge of the leads 120a and 120b adjacent to the loop portion 130 shown as 120a$_1$ and 120b$_1$.

The additional material 130a, 120d, 120a$_1$ and 120b can be bent to provide folded features including a planar portion and a folded edge structure that curves upwards at an angle of at least 45° relative to the planar portion. In one arrangement, the angle is 180° relative to the planar portion to be in physical contact with the planar portion, thus being folded back upon itself. In another arrangement, the additional material is bent to provide a folded edge structure that together with the adjacent planar portion provides a double (2×) leadframe thickness, such as being effectively 16 mils thick for a nominal leadframe thickness of 8 mils.

Figure 1B:
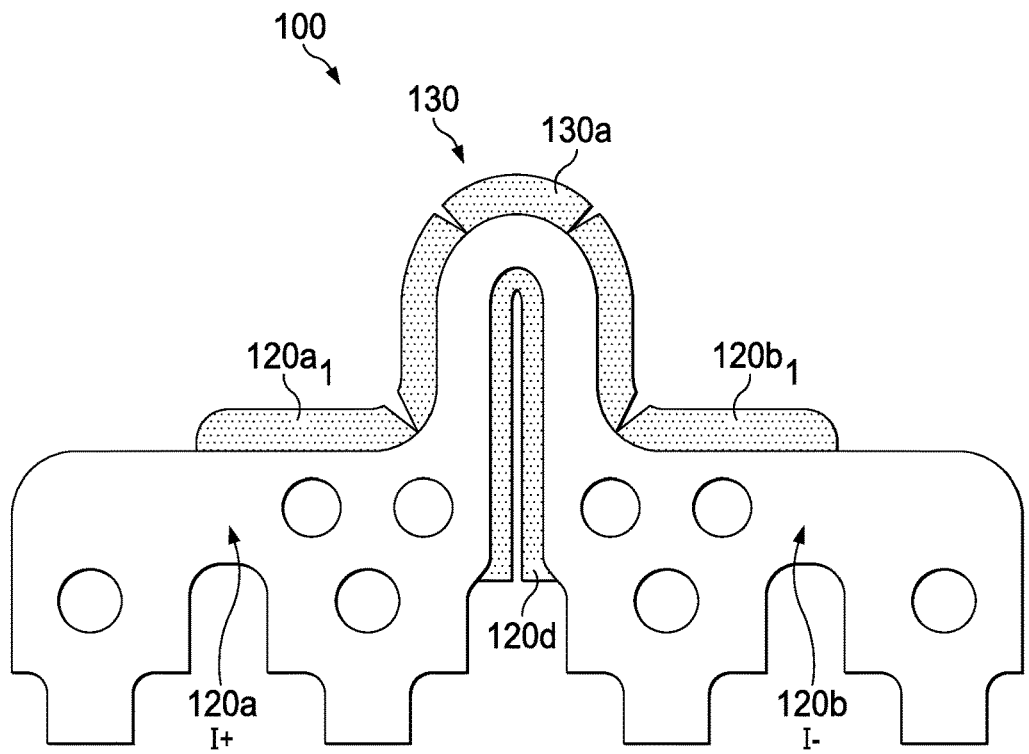
FIG. 1B shows the result of optionally making first and second cuts in the locations shown of the additional material that facilitates later bending and folding of the additional material to begin forming the folded features. The cuts are only provided to represent the required deformation of the additional material to make the bends.

FIG. 1B shows the result of optionally making first and second cuts in the locations shown of the additional material 120d, 120a$_1$ and 120b, and 130a that facilitates later bending and folding of the additional material to form a folded edge structure. The cuts are generally optional, and are only shown to represent the required deformation of the additional material 120d, 120a$_1$ and 120b, 130a to enable making the bends.

Figure 1C:
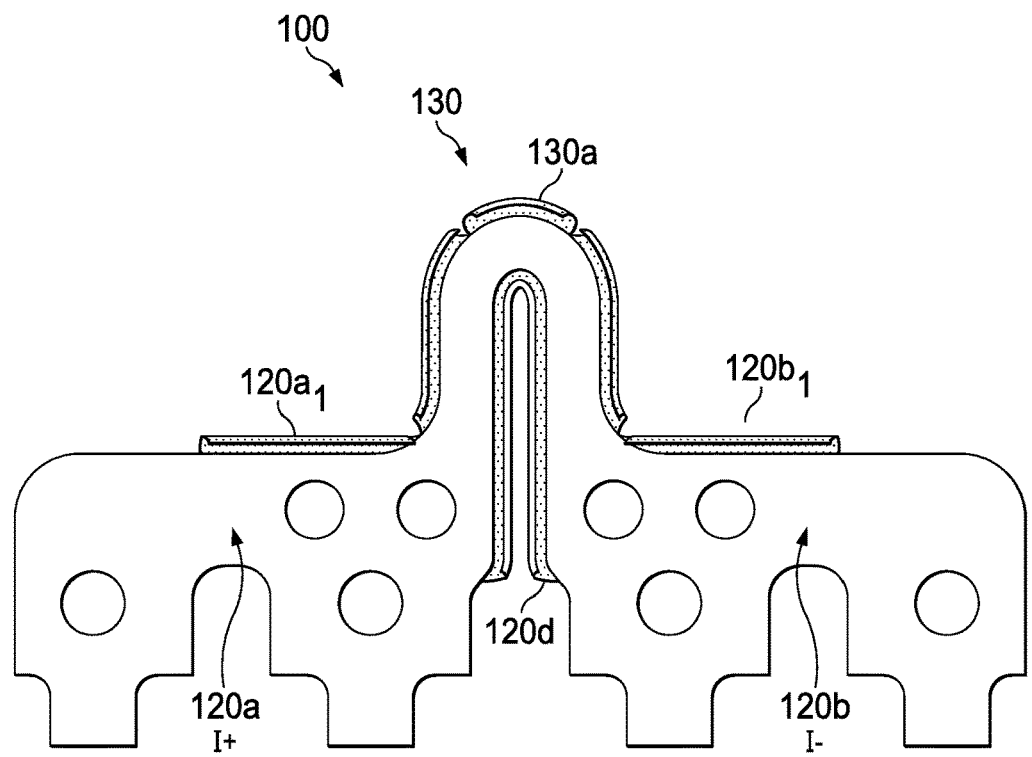
FIG. 1C shows the resulting leadframe after a portion of the folding and bending of the additional material.

For example, the cuts shown in FIG. 1B may not be necessary before bending if there is sufficient ductility of the metal material (e.g., copper) of the leadframe. Alternatively, the additional material 120d, 120a$_1$, 120b and 130a can be deformed by processes including hydrostatic compression or stamping. FIG. 1C shows a result of the leadframe 100 after a portion of the folding and bending of the additional material 120d, 120a$_1$, 120b and 130a.

Figure 1D:
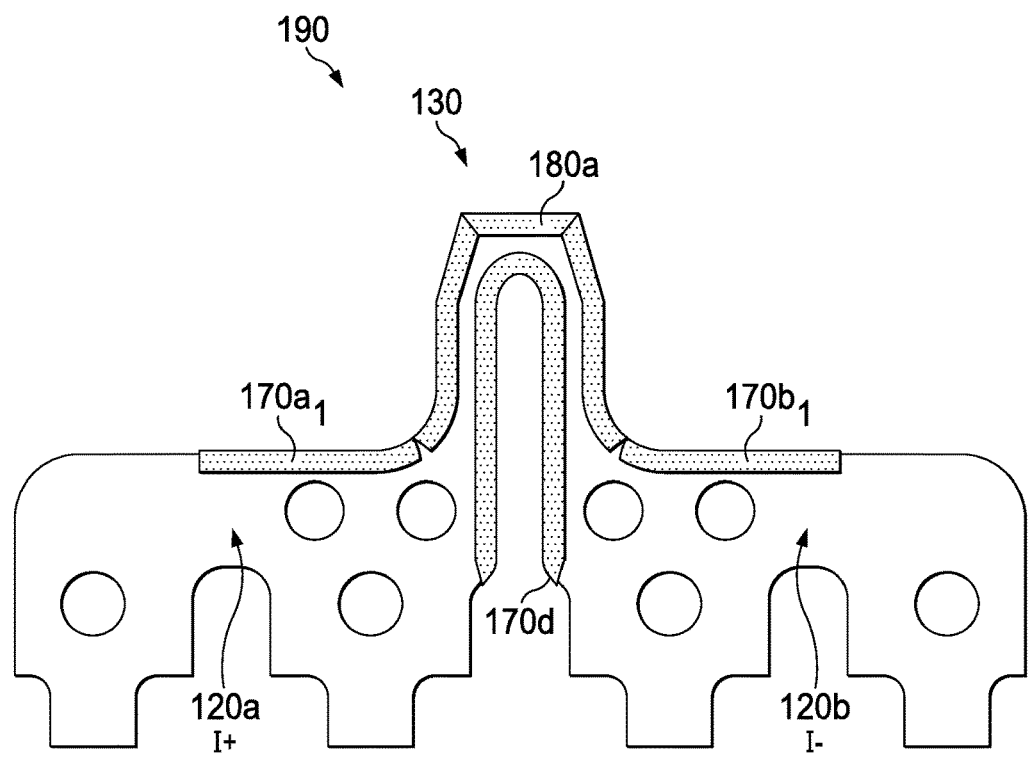
FIG. 1D shows a side of a finished leadframe after the bending and folding of the additional material to form folded features that as a result of providing additional cross-sectional area provide effectively roughly twice the metal thickness around the loop portion, and along the portion between the fused leads adjacent to loop portion.

FIG. 1D shows a side of a finished leadframe now shown as 190 after completion of the bending and folding of the additional material 120d, 120a$_1$, 120b and 130a shown in FIG. 1C to form folded edge structures now shown as folded edge structures 170d, 170a$_1$, 170b$_1$ and 180a. The folded edge structures provide additional cross-sectional area providing effectively roughly twice the metal thickness around the loop portion 130 and along the portion between the leads 120a and 120b adjacent to loop portion 130.

Figure 2:
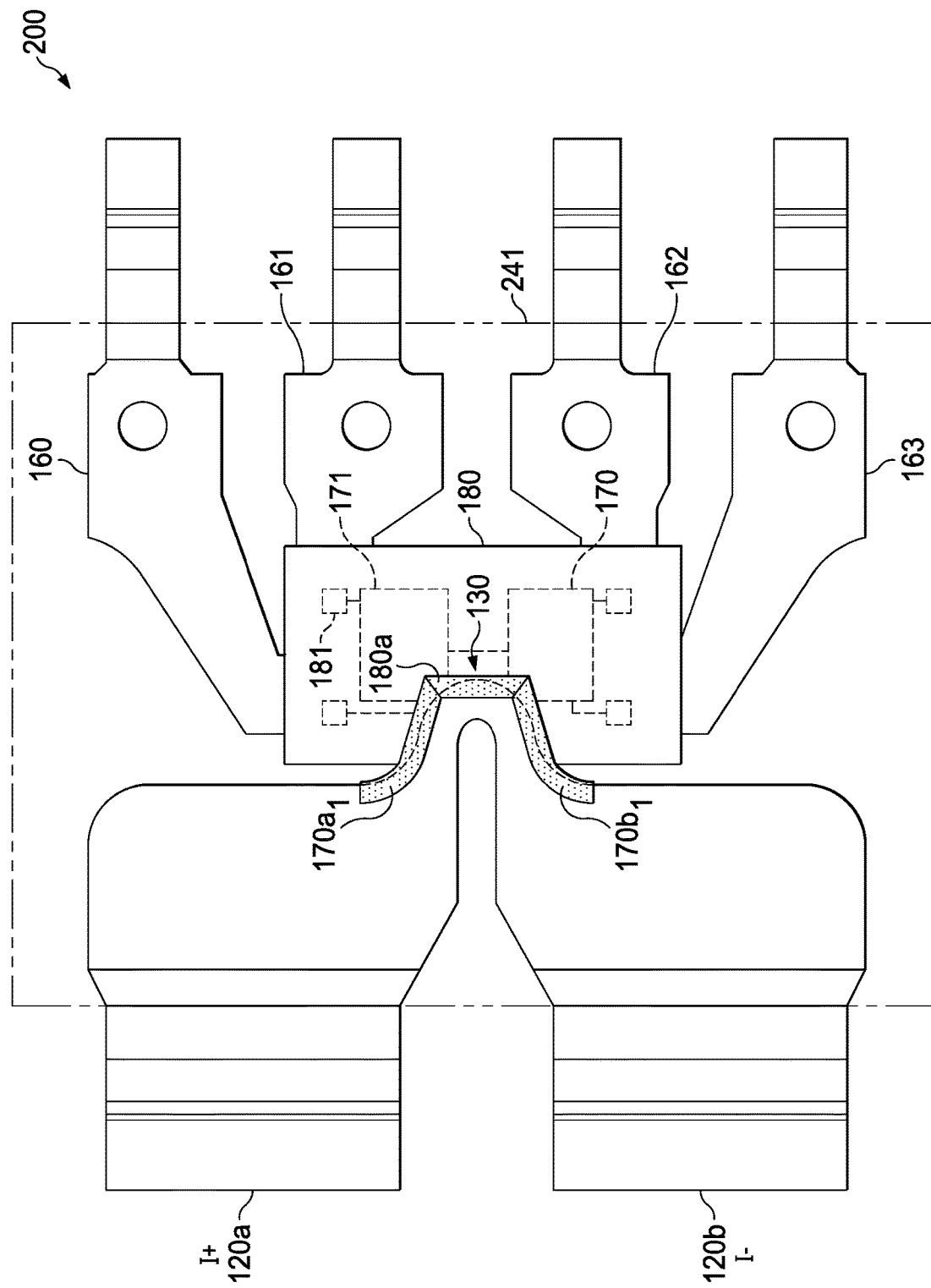
FIG. 2 shows a top see-through view of an example package Hall-effect sensor device comprising a leadframe having disclosed folding and bending along the loop to form folded features, with an IC die with bond pads, and a Hall-effect element, both flipchip mounted onto lead terminals of the leadframe. The curved portion of the loop portion is below the IC die, and the IC die is only on the lead terminals, thus being in a flipchip on lead (FCOL) configuration.

FIG. 2 shows a top see-through view of an example package Hall-effect sensor device 200 comprising a leadframe having disclosed folding and bending of additional material along the loop 130 to provide a folded edge structure 180a and also additional material to provide the folded edge structures 170a$_1$, 170b$_1$ along an a surface of the leads 120a, 120b adjacent to the loop 130. Also shown is an IC die 180 with bond pads 181, and a Hall-effect element 170, both flipchip mounted onto lead terminals 160-163 of the leadframe. The lead terminals 160-163 are again shown as being fused lead terminals. The curved portion of the loop 130 is below the IC die 180, and the IC die 180 is on the lead terminals 160-163, thus being in a FCOL configuration.

"Fused leads" as used herein means only a single I+ pin generally being a fused lead 120a and a single I− pin shown as fused lead 120b, as shown in FIG. 2 for a first FGC path. These pins each have a cross-sectional area dimension of more than 2 times that of conventional single leads which are generally located on the opposite side (output side) of the leadframe that includes lead terminals 160-163. Although not visible in the view shown, between the fused leads 120a and 120b is a first reduced width curved loop (or head).

The lead terminals 160-163 can respectively comprise $V_{CC}$, Vout (providing the sensed Hall voltage), Vref (the reference voltage) and a ground. The respective loops both do not electrically contact the IC die 180. The loop that is not shown is for providing a magnetic (B) field to the Hall-effect element 170, and the loop 130 is also generally configured to provide the same function.

The conventional single lead terminals 160, 161, 162 and 163 make an electrical contact to the bond pads 181 on the IC die 180. In one arrangement, as noted above, the lead terminal 160 can comprise VCC, lead terminal 161 can comprise Vout, lead terminal 162 can comprise Vref, and lead terminal 163 can comprise a ground. In operation, a DC power supply applied between lead terminal 160 and lead terminal 163 generates a constant current flow that flows in the semiconductor Hall-effect element 170, such as in a p-type Hall effect element. The IC die 180 is then mounted onto the leadframe 200, followed by applying a mold compound. Lastly, the package is trim-and-formed to remove the frame portion of the leadframe, and the leads are then generally then bent, such as in the gull-wing shape.

The Hall element on the IC die 180 includes a "Hall plate" which may comprise an epitaxial layer on a substrate, such as a semiconductor substrate including silicon in one particular example. The epitaxial region may have low to medium level of doping, such as a relatively lightly-doped pwell region. The Hall-effect element 170 may include vias. The Hall-effect IC die 180 may include one or more dielectric passivation layers comprising a nitride, an oxide, a polymer, a polyimide, or benzocyclobutene (BCB).

Although a flipchip arrangement for the IC die 180 is shown in FIG. 2 that generally utilizes pillars on the bond pads 181, other flipchip bonding arrangements may be used such as utilizing solder balls on the bond pads 181. Moreover, the IC die 180 may be assembled top side up with wirebonds or another connection technology to make the connections between the bond pads 181 and the leads or lead terminals of the leadframe.

There is signal processing circuitry 171 shown in FIG. 2 coupled to an output of the Hall-effect element 170, where the signal processing circuitry 171 generally includes at least one amplifier. Mold compound is shown in FIG. 2 as 241.

Figure 3:
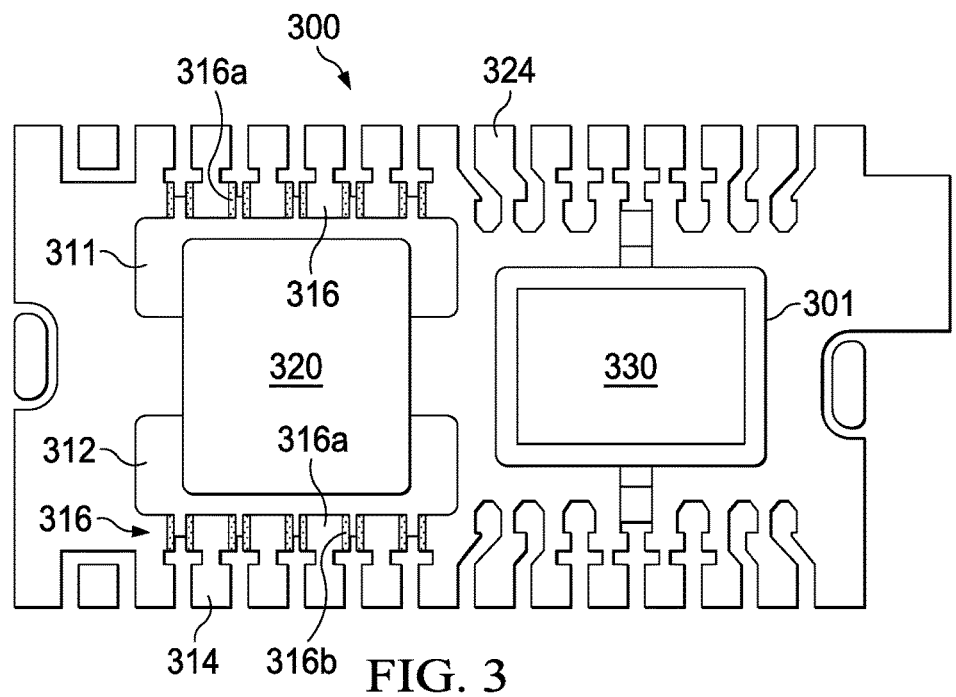
FIG. 3 shows an example leadframe for a shunt-type current sensor that includes a first pad and a second pad upon which a current shunt is shown placed thereon for creating a current path, and also a die pad for mounting a sensor IC die. There are downset support features for the first pad and second pad that include folded features including a planar portion and a folded edge structure that curves upwards at an angle of at least 45° relative to the planar portion.

FIG. 3 shows an example leadframe 300 for a shunt-type current sensor that includes a first pad 311 and a second pad 312 upon which a current shunt 320 is shown placed thereon for creating a current path, and also a die pad 301 for mounting a sensor IC die 330. There are downset support features for the first pad 311 and the second pad 312 that include folded features including a planar portion 316a and a folded edge structure 316b that curves upwards at an angle of at least 45° relative to the planar portion 316a. The folded edge structure 316b increases the thickness of the downset support features 316 as compared to the planar portion 316a alone that is conventionally provided. The leadframes generally arrive with the first pad 311 and the second pad 312, and the die pad 301, all being downset relative to the leads 314, 324, and the downset support features 316 including additional material for bending to provide the folded edge structure 316b from the leadframe supplier. The leadframe supplier can generally perform the bending of the additional material to provide the folded edge structures 316b.

Figure 4A:
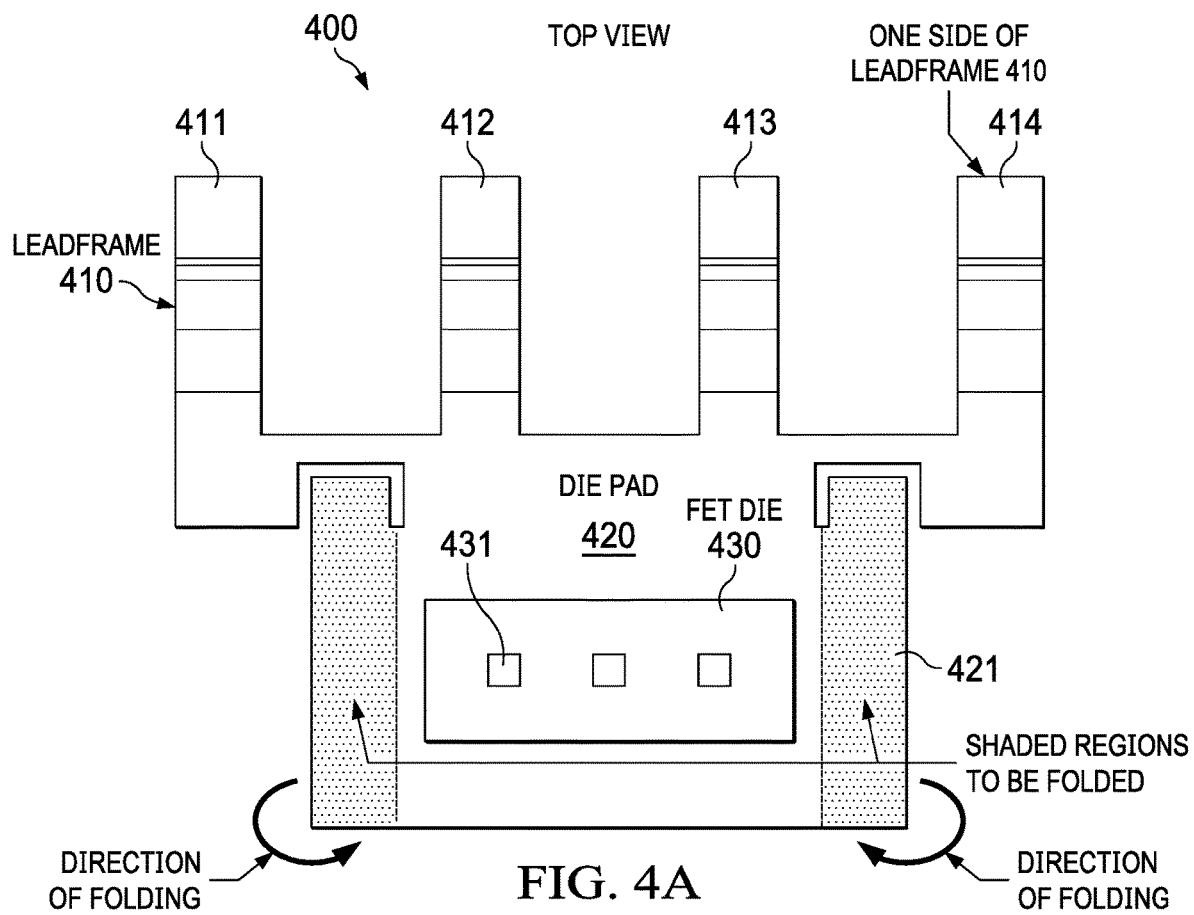
FIGS. 4A-4C show a packaged FET comprising a high-power FET die on the die pad of an example leadframe with the die pad shown optionally configured with an exposed die pad that has additional material that in FIGS. 4B and 4C is shown bent and folded to provide folded features that increase the thickness of a portion of the die pad.
Figure 4B:
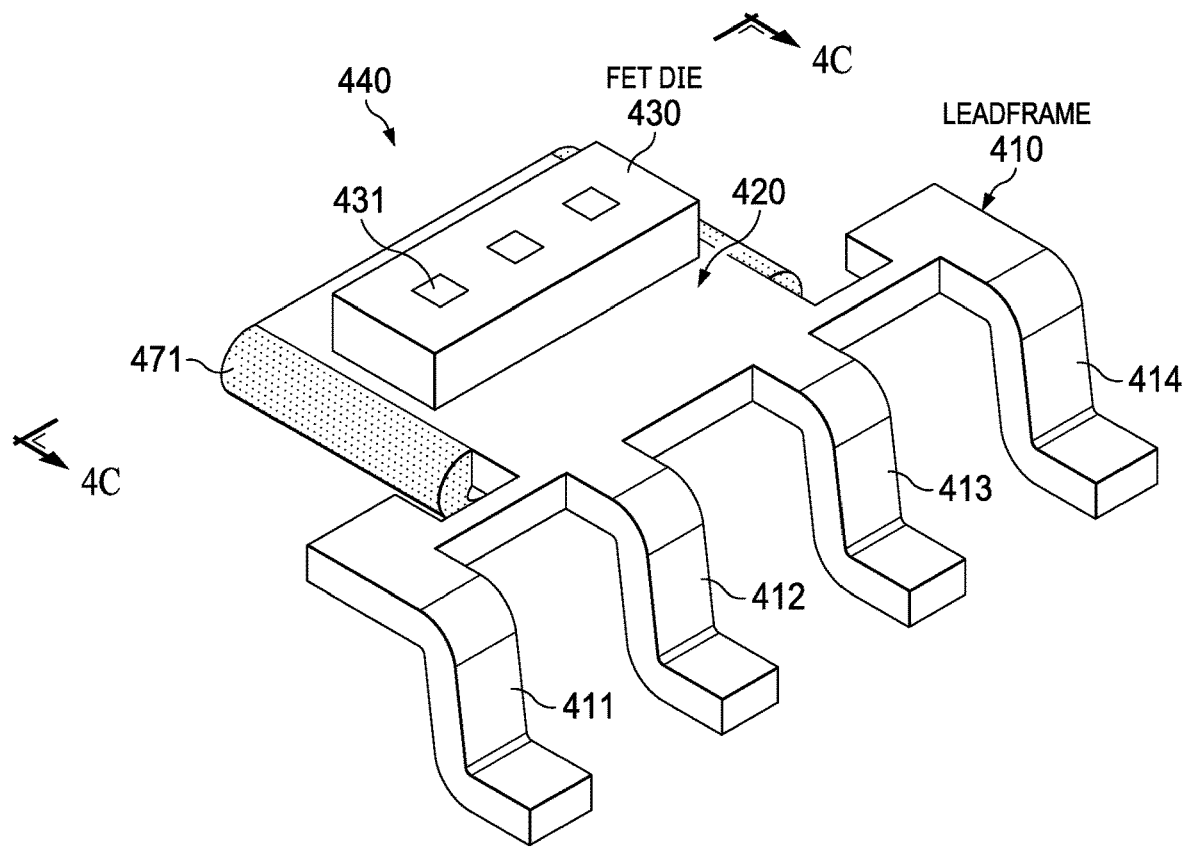
Figure 4C:
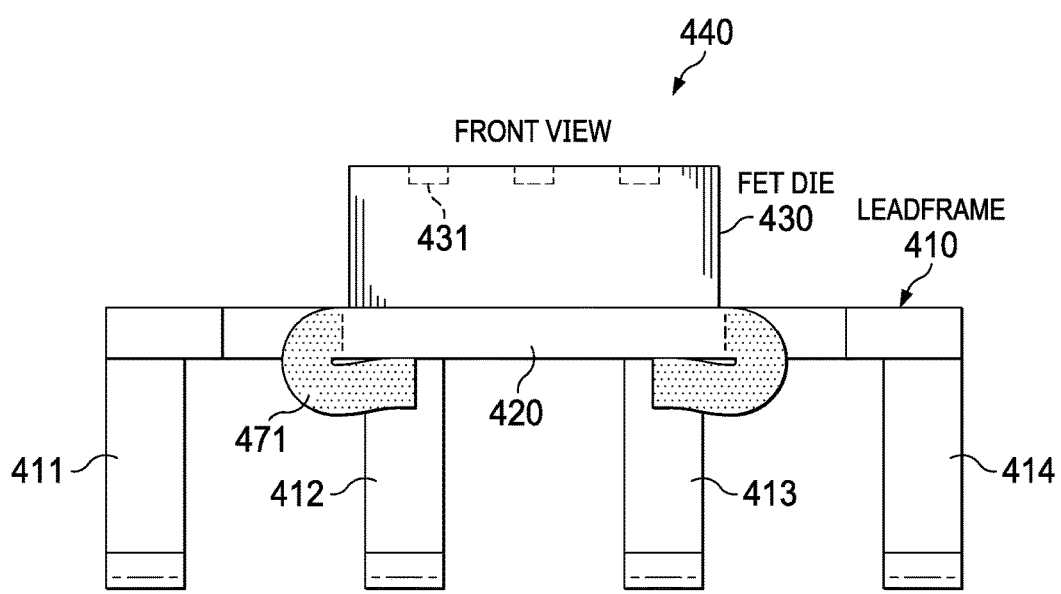

FIGS. 4A-4C show a packaged FET 400 comprising a high-power FET die 430 on the die pad 420 of an example leadframe 410 with a die pad shown optionally configured as an exposed die pad 420 that has additional material bent to form the folded edge structures 421 that in FIGS. 4B and 4C is bent and folded to increase the thickness of a portion of the die pad 420. Disclosed aspects also include non-exposed die pads that have the die pad electrically isolated by the mold compound.

FIG. 4A is a top view of one side of a package FET 400 including an example leadframe including disclosed folded features shown as a half of a leadframe 410 that is illustrating a die pad 420 with additional material 421 in die pad sections, shown as being shaded regions, and located on the edge of the die pad 420. FIG. 4A also shows a side of the FET die 430 before the bending and folding of the additional material 421 that is used to form the folded edge structures 471 shown in FIGS. 4B and 4C described below, with arrows provided showing the direction to be folded. The leads on the side of the leadframe are shown as 411-414. Although not shown, there are generally bondwires between the leads 411-414 and the bond pads 431 on the top surface of the FET die 430.

FIG. 4B shows a 3D depiction of the package FET 400 shown in FIG. 4A now shown as package FET 440 after folding of the additional material 421 to form folded edge structures 471. FIG. 4C is a front view depiction of the packaged FET 440 shown in FIG. 4B from the perspective of the eye when it is being viewed from the far left of FIG. 4C.

Examples

Disclosed aspects are further illustrated by the following specific Examples, which should not be construed as limiting the scope or content of this Disclosure in any way.

Figure 5A:
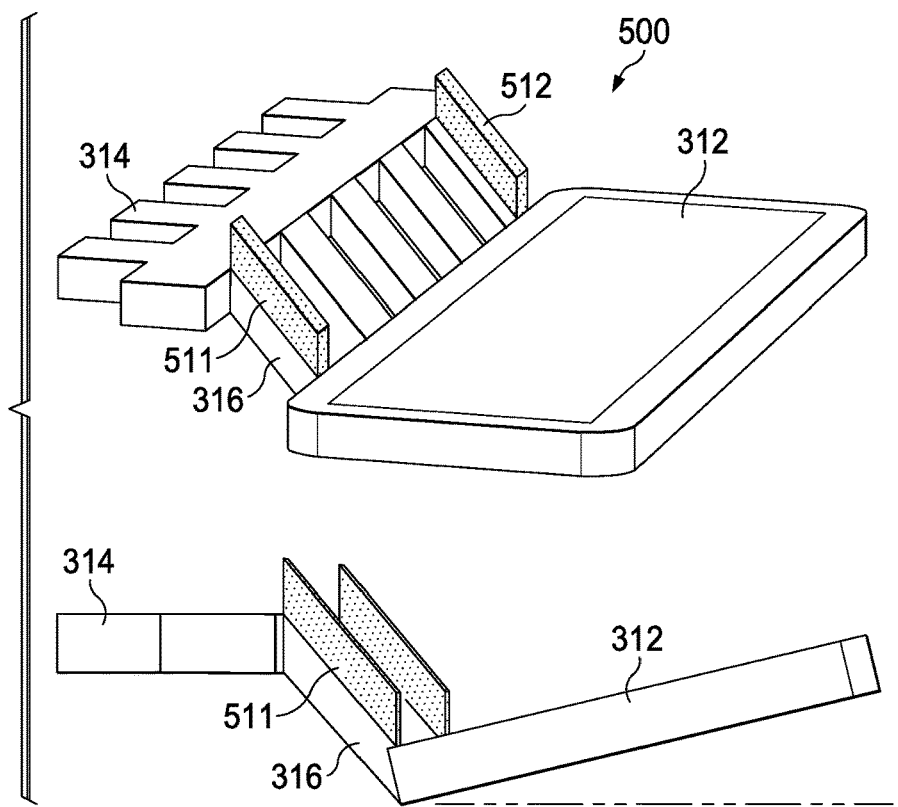
FIGS. 5A-5C shows various example designs for a leadframe having folded features shown for a shunt-type current sensor that includes first and second pads upon which a current shunt is placed thereon for creating a current path, and also a die pad for a sensor IC die. Only the lead terminals associated with the first and second pads are shown along with the downset support features shown including additional material that is bent and folded to provide folded features that increase the effective thickness of the downset support features.

A linear numerical model was created using a unit shear force [1 N/m$^2$] at the LDF die attach pad (DAP) or pads for the current shunt to simulate the deformation observed during assembly. For conventional pads for the current shunt and downset support features for the pads of the current shunt, such as downset support features 316 (without the folded edge structure 316b) and first and second pads 311 and 312 shown in FIG. 3 above, the displacement was found to be 54.6 nm. For the leadframe portion 500 shown in FIG. 5A that included only the endmost downset support features 316 having the folded edge structure now shown as 511 and 512 having disclosed bending to provide an extra effective thickness to provide additional mechanical robustness, the displacement during assembly of the pad shown as 312 for the current shunt was reduced to 36.7 N/m$^2$, or 67.2% as compared to the original leadframe design. Leads are shown as 314.

Figure 5B:
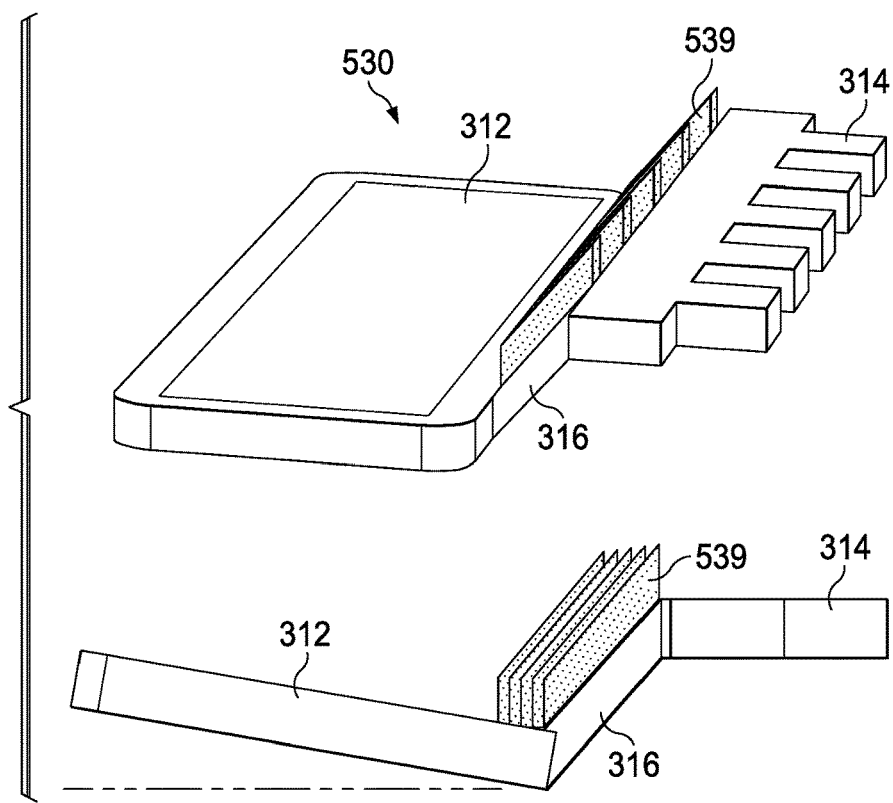

The leadframe portion 530 shown in FIG. 5B includes additional material now shown as folded edge structure 539 for the downset support features 316 to provide extra thickness to provide additional mechanical robustness. The term folded edge structure as used here means that the downset portion of the downset support features 316 include a folded edge structure 511, 512 similar to that shown in FIG. 5A. However, in FIG. 5B all the downset support features 316 had additional material configured as the folded edge structure 511 and 512, where in FIG. 5A only the outer downset support features 316 had the folded edge structure 511 and 512. The displacement during assembly for pads 312 for the current shunt for this leadframe having the folded edge structures 511 and 512 was found to be reduced to 25.4 N/m$^2$, or a 46.5% reduction compared to the original LDF design lacking the folded edge structures 511 and 512.

Figure 5C:
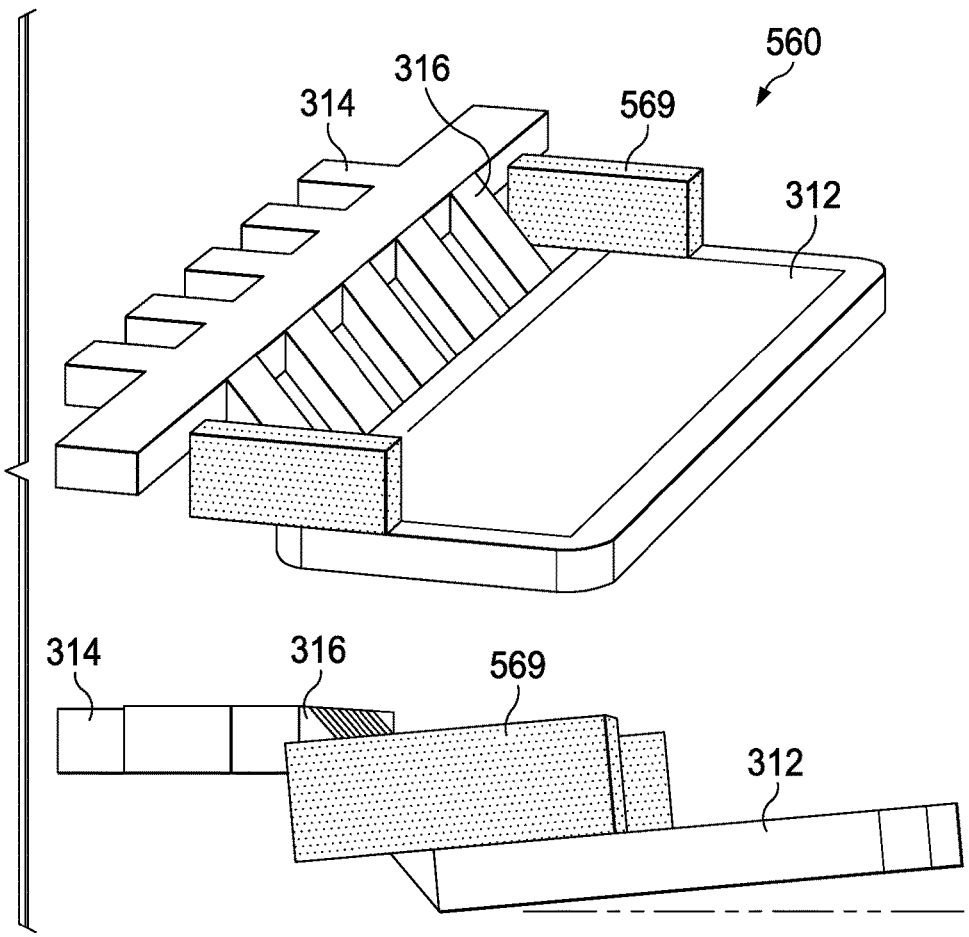

The leadframe portion 560 shown in FIG. 5C includes downset support features 316 having disclosed folded edge structures 569 for providing an extra thickness configured as interlocking pad ears. The folding of the folded edge structures 569 creates a constrained region such that that the pad 312 for the current shunt cannot move further because the pads including pad 312 hits the pad ears 569 when moved. The displacement during assembly for the pad 312 for the current shunt was found to be reduced to 23.3 N/m$^2$, or a 43.7% reduction as compared to the original LDF design.

Disclosed aspects can be integrated into a variety of assembly flows to form a variety of different leadframe-based packaged devices and related products. The assembly can comprise single semiconductor die or multiple semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those having ordinary skill in the art to which this Disclosure relates will appreciate that many variations of disclosed aspects are possible within the scope of the claimed invention, and further additions, deletions, substitutions and modifications may be made to the above-described aspects.

The invention claimed is:

1. A leadframe, comprising:
leads or lead terminals on at least opposing sides;
a plurality of folded features comprising i) support features positioned within an area defined in at least one dimension by the leads or the lead terminals configured for supporting at least one of a die pad and a first pad and a second pad spaced apart from one another, or ii) current carrying features, and
wherein at least one of the plurality of folded features include a planar portion and a folded edge structure that curves upwards at an angle of at least 45° relative to the planar portion.

2. The leadframe of claim 1, wherein the angle is 180° relative to the planar portion to be in physical contact with the planar portion.

3. The leadframe of claim 1, wherein the plurality of folded features comprise the plurality of support features that comprise connecting downset features for supporting the die pad or the first pad and the second pad, wherein only outer ones of the connecting downset features are bent.

4. The leadframe of claim 1, wherein the plurality of folded features comprise the support features that comprise connecting downset features for supporting the die pad or the first pad and the second pad, wherein all the connecting downset features are bent.

5. The leadframe of claim 1, wherein the plurality of folded features comprise the support features that comprise connecting downset features for supporting the die pad or the first pad and the second pad.

6. The leadframe of claim 1, wherein the leadframe includes the die pad, the first pad, and the second pad, and wherein the first pad and the second pad include the plurality of folded features.

7. A packaged device, comprising:
a leadframe, comprising:
leads or lead terminals;
a plurality of folded features comprising i) support features positioned within an area defined in at least one dimension by the leads or the lead terminals configured for supporting at least one of a die pad and a first pad and a second pad spaced apart from one another, or ii) current carrying features, and
wherein at least one of the plurality of folded features includes a planar portion and a folded edge structure that curves upwards at an angle of at least 45° relative to the planar portion, and
an integrated circuit (IC) die having bond pads that are coupled to the leads or to the lead terminals.

8. The packaged device of claim 7, wherein the packaged device comprises a Hall-effect current sensor package, further comprising a Hall-effect sensor element and signal processing circuitry including at least an amplifier coupled to an output node of the Hall-effect element, wherein the IC die and the Hall-effect sensor element are both flipchip attached to the leads or lead terminals.

9. The packaged device of claim 7, wherein the IC die comprises a power field effect transistor (FET).

10. The packaged device of claim 7, wherein the angle is 180° relative to the planar portion to be in contact with the planar portion.

11. The packaged device of claim 7, wherein the leads or the lead terminals are on opposite sides of the packaged device.

12. The packaged device of claim 7, wherein the plurality of folded features comprise the support features that comprise connecting downset features for supporting the die pad or the first pad and the second pad.

13. A method of forming a leadframe, comprising:
providing a leadframe sheet comprising a plurality of leadframe sites each with leads or lead terminals, and plurality of features positioned within an area defined in at least one dimension by the leads or the lead terminals;
bending an edge of at least one of the plurality of features to form a folded feature comprising i) a support feature positioned for supporting at least one of a die pad and a first pad and a second pad spaced apart from one another, or ii) current features;
wherein the folded feature includes a planar portion and a folded edge structure that curves upwards at an angle of at least 45° relative to the planar portion.

14. The method of claim 13, wherein the bending further comprises forming through-cuts before the bending.

15. The method of claim 13, wherein the bending is exclusive of any cuts, and wherein the bending comprises hydrostatic compression or stamping.

16. The method of claim 13, wherein the angle is 180° relative to the planar portion to be in contact with the planar portion.

17. The method of claim 13, wherein the plurality of folded features comprise the plurality of support features that comprise connecting downset features for supporting the die pad or the first pad and the second pad, wherein only outer ones of the connecting downset features are bent.

18. The method of claim 13, wherein the plurality of folded features comprise the support features that comprise connecting downset features for supporting the die pad or the first pad and the second pad, wherein all the connecting downset features are bent.

19. The method of claim 13, wherein the plurality of folded features comprise the support features that comprise connecting downset features for supporting the die pad or the first pad and the second pad.

20. The method of claim 13, wherein the leadframe includes the die pad, the first pad, and the second pad, and wherein the first pad and the second pad include the plurality of folded features.

21. A method of making a packaged device, comprising:
providing a leadframe with leads or lead terminals, and a plurality of features positioned within an area defined in at least one dimension by the leads or the lead terminals;
bending an edge of at least one of the plurality of features to form a folded feature comprising i) a support feature positioned for supporting at least one of a die pad and a first pad and a second pad spaced apart from one another, or ii) current features;
wherein the folded feature includes a planar portion and a folded edge structure that curves upwards at an angle of at least 45° relative to the planar portion; and
attaching to the die pad an integrated circuit (IC) die having bond pads that are coupled to the leads or to the lead terminals.

22. The method of claim 21, wherein the bending is exclusive of any cuts, and wherein the bending comprises hydrostatic compression or stamping.

23. The method of claim 21, wherein the angle is 180° relative to the planar portion to be in contact with the planar portion.

24. The method of claim 21, wherein the plurality of folded features comprise the support features that comprise connecting downset features for supporting the die pad or the first pad and the second pad.

25. The method of claim 21, wherein the leadframe includes a die pad, a first pad, and a second pad, and wherein the first pad and the second pad include the plurality of folded features.

26. The method of claim 21, further including covering the IC die and at least a portion of the lead frame with mold material.

* * * * *